United States Patent [19]

Fujishima et al.

[11] Patent Number: 5,457,348
[45] Date of Patent: Oct. 10, 1995

[54] HIGH-CURRENT INTEGRATED CIRCUIT WITH WIRING FOR MINIMIZED ON-RESISTANCE

[75] Inventors: Naoto Fujishima; Kenichi Ishibashi, both of Matumoto, Japan

[73] Assignee: Fuji Electric Co., Ltd., Kawasaki, Japan

[21] Appl. No.: 951,679

[22] Filed: Sep. 25, 1992

[30] Foreign Application Priority Data

Sep. 27, 1991 [JP] Japan ................... 3-249300

[51] Int. Cl.$^6$ ........................ H01L 29/10; H01L 29/784
[52] U.S. Cl. ........................ 307/566; 257/328; 257/341; 327/564
[58] Field of Search ................ 307/303.2, 303, 307/303.1; 257/328, 341, 342

[56] References Cited

U.S. PATENT DOCUMENTS

| | | | |
|---|---|---|---|
| 4,963,970 | 10/1990 | Throngnumchai et al. | 257/328 X |
| 5,010,386 | 4/1991 | Groover, III | 257/328 X |
| 5,034,796 | 7/1991 | Zommer | 307/303.1 |
| 5,041,895 | 8/1991 | Contiero et al. | 257/328 X |
| 5,095,343 | 3/1992 | Klodzinski et al. | 257/328 |
| 5,191,395 | 3/1993 | Nishimura | 257/328 |
| 5,268,586 | 12/1993 | Mukherjee et al. | 257/341 X |
| 5,313,088 | 5/1994 | Takahashi et al. | 257/328 |
| 5,324,971 | 6/1994 | Notley | 257/328 |
| 5,338,961 | 8/1994 | Lidow et al. | 257/341 X |

OTHER PUBLICATIONS

Low Resistance Power LDMOSFET Using Double Metal Process Technology; Hoshi et al. pp. 61–63, Jun. 1991.

*Primary Examiner*—Willis R. Wolfe
*Attorney, Agent, or Firm*—Brumbaugh, Graves, Donohue & Raymond

[57] ABSTRACT

On-resistance is minimized in a high-current integrated circuit by efficient use of wiring spaces for various layers in a wiring construction with multilayer-wiring connections between transistor electrode regions and electrode terminals. The construction utilizes multiple wiring layers and interlayer insulation films between the wiring layers, which insulation films have connecting holes at specified portions of the wiring structure. By incorporating connecting holes at select locations, and utilizing spaces which are not used for connecting holes as spaces for routing different wiring layers, the wiring structure allows overlapping wiring connections between the transistor electrode regions and the electrode terminals.

8 Claims, 8 Drawing Sheets

HIGH-CURRENT INTEGRATED CIRCUIT WITH WIRING FOR MINIMIZED ON-RESISTANCE

BACKGROUND OF THE INVENTION

The present invention relates to the wiring construction of a high-current integrated circuit, and more particularly to a high-current integrated circuit for minimizing on-resistance which utilizes a multilayer wiring construction.

Size and cost reduction, performance diversification and improved reliability realized in factory automation and office automation devices in recent years are largely attributable to improvements in component sizes, functions and performance, areas in which further improvements are expected. For example, it is expected that hard-disk devices mounted on personal computers will be reduced from their current size, 2.5 inches, to 1.8 inches within a few years. Moreover, the LSI's ("large-scale-integrated" circuits) used in these devices will have their driver section and the control section combined on one chip, for which construction a driver section that can process a current in excess of 1 ampere will be required. For a high-current integrated circuit having such a construction, the on-resistance of the circuit is an important factor determining the relationship between an LSI's processing current and its size.

An explanation of the relationship between the conventional wiring construction of an integrated circuit and its on-resistance is provided hereunder using FIG. 9 as an example. FIG. 9 shows an integrated circuit with three-phase half bridge circuits for driving a three-phase motor. The half bridge circuit in this integrated circuit consists of first- to third-phase high-side transistors 701–703 and first- to third-phase low-side transistors 704–706 corresponding to each of the coils 716 serving as a load. Each of the coils 716 is sequentially driven, for example along the current path 717, by means of the transistors 701–706 performing switching operations based on control signals from the control section, thereby providing the motor with the torque required for its rotation.

The first- to third-phase high-side transistors 701–703 are electrically connected to the power source (drain potential at VDD) via the high-side common terminal wiring layer, which has parasitic resistance 709. Furthermore, the first- to third-phase low-side transistors 704–706 are grounded (source potential at VSS) via the low-side common terminal wiring layer, which has parasitic resistance 710. A current-controlling transistor 707 may be interposed as required, if the on-resistance varies in the first- to third-phase low-side transistors 704–706. The number 711 designates the parasitic resistance generated between the current controlling transistor 707 and a ground terminal, and the numbers 712–714 represent the parasitic resistance in the output wiring layers of each phase. In a three-phase half bridge circuit of this construction, the parasitic resistances 709–714 greatly affect the current-carrying capacity of an integrated circuit.

Next, an explanation of the wiring constructions of each component of a high-current integrated circuit is provided hereunder. As an example, a conventional wiring construction for each electrode region (a source region and a drain region) of a MOSFET used in a high-current integrated circuit is explained. In such a MOSFET, the source region is connected to a power source terminal, and the drain region is connected to an output terminal. In FIG. 10, which shows a plan view of an output MOSFET, a drain region 16 has a first output wiring layer 13 positioned below a second output wiring layer 14 in a multilayer wiring construction, the two output wiring layers being electrically connected in parallel to the electrode terminal 15. Moreover, the source region 18 has a first power-source wiring layer 19 positioned below a second power-source wiring layer 20 in a multilayer wiring construction, the two power-source wiring layers being electrically connected in parallel.

By forming the first output wiring layer 13 in parallel with the second output wiring layer 14, and the first power source wiring layer 19 in parallel with the second power source wiring layer 20, the on-resistance of the device shown in FIG. 10 is minimized. The minimization is particularly significant with respect to the on-resistance between the region 12 and the electrode terminal 15 because the current flow in the region 12, which is located closer to the electrode terminal 15 than the region 11 is located from the terminal 15, is higher than that in the region 11.

However, with such a wiring structure as shown in FIG. 10, the distance required for drawing round the power source wiring layer 20 is unduly increased, because both the output wiring layers 13 and 14, and the power-source wiring layers 19 and 20, are formed in regions away from the output-MOSFET-forming-region 17. Consequently, a higher wiring resistance results. In addition, the wiring-layer-forming regions require a larger area, which is not desirable given the demand for size reduction.

If one attempts to minimize the device size by constructing the output wiring layers 13 and 14, for example, as a single layer so that the power source wiring layer 20 can pass over the layers, this construction results in increased wiring resistance. In other words, with the type of wiring-layer construction shown in FIG. 10, minimization of the wiring resistance can only be achieved at the cost of reduced integration density.

Another conventional wiring structure for an output MOSFET is explained hereunder with reference to FIG. 11. FIG. 11(a) shows a plan view of the wiring structure for an output MOSFET, and FIG. 11(b) shows a cross section taken along the b—b line of FIG. 11(a). FET cells consisting of a semiconductor substrate region 803, $n^+$-type drain regions 806, a p-type base layer 805, $n^+$-type source regions 804 inside the p-type base layer 805, and gate electrode layers 807 on the semiconductor substrate region 803, are constructed in a lattice-like arrangement. With this construction, source wiring layers 808 formed on the surface of first interlayer insulation films 811 are electrically connected to each source region 804 via source connecting holes 801. In addition, drain-wiring layer 809 formed on the surface of second interlayer insulation films 812 are electrically connected to each drain region 806 via drain connecting holes 802, thereby completing the output MOSFET 800.

In this output MOSFET 800, a current flows in the direction of arrow "A" from an electrode terminal 809a on the drain wiring layer 809, while the current flows out in the direction of arrow "B" to an electrode terminal 808a on the source wiring layer 808 through each drain region 806, source region 804, and source wiring layer 808. During the current flow, the current concentrates on the input terminal 809a in the drain wiring layer 809. Consequently, the output MOSFET 800 has a high on-resistance which results from the uneven distribution of the current density.

If one attempts to minimize the wiring resistance in each wiring layer 808 and 809 without altering the wiring positions of each component, the integration density must be sacrificed or the wiring-construction thickness must be increased. The wiring-construction thickness must be increased because the wiring positions for the wiring layers 808 and 809 are determined by the distribution of the connecting holes which correspond to the arrangement of each FET cell. However, reducing the wiring resistance by increasing the wiring layer thickness requires that the thickness be increased several times over. Consequently, this creates a new problem in that flatness must be sacrificed.

As described above, the conventional wiring construction which incorporates either the output MOSFET 17 or 800 in an integrated circuit results in a high on-resistance. Other device characteristics must be sacrificed if the on-resistance is to be improved. Furthermore, a conventional high-current integrated circuit has additional on-resistance problems stemming from the wiring connection from the MOSFET to the load.

For example, FIG. 12 shows a wiring structure corresponding to the circuit shown by region "C" indicated by broken lines in the half bridge circuit in FIG. 9. A first-phase output wiring layer 909 is arranged in parallel between a first-phase, low-side transistor 901 and a first-phase, high-side transistor 904. Also, a second-phase output-wiring layer 910 and a third-phase output-wiring layer 911 are arranged in parallel between a second-phase, low-side transistor 902 and a second-phase, high-side transistor 905, and between a third-phase, low-side transistor 903 and a third-phase, high-side transistors 906, respectively. In this construction, the transistors 901–906 are arranged in such an order that the adjoining low-side or high-side transistors are arranged opposite each other, and the tips of a low-side common terminal wiring layer 907 and a high-side common terminal wiring layer 908 are bent in order to adjoin the transistors.

Although not shown in FIG. 12, each low-side transistor 901–903 has one of its electrode regions, the source region, electrically connected to the low-side common terminal wiring layer 907, while the other electrode region, the drain region, is electrically connected to the output-wiring layers 909–911 of each phase. Also, each high-side transistor 904–906 has one of its electrode regions, the drain region, electrically connected to the high-side common terminal wiring layer 908, while the other electrode region, the source region, is electrically connected to the output wiring layers 909–911 of each phase. Furthermore, the common terminal wiring layers 907 and 908, and the output-wiring layers 909–911 of each phase, are provided with a power source pad 912, a low-side common terminal pad 913, and output pads 914–916, respectively.

In this wiring structure, the common terminal wiring layers 907 and 908 are C-shaped such that they are closely positioned near the vicinity of the transistors 901–906, thereby reducing the resistance in the wiring layers used for their connection. However, this arrangement requires greater lengths for the common terminal wiring layers 907 and 908, and results in an undesirable effect of increased wiring resistance because of the increased length. For example, given a drain potential of $V_{DD}$ and a source potential of $V_{SS}$, and the target on-resistance to be generated in an integrated circuit is about 1 ohm, the wiring resistance alone accounts for about 50% of the total resistance.

To eliminate this problem, measures such as increasing the wiring layer thickness to about three to five times its conventional thickness or expanding the wiring-layer width are possible. However, these measures create new problems such as decreased flatness of the device, increased cost and chip size, and the "edge touch" of the wiring wires due to the increased distance between the scribe line and the pad.

As described above, while the conventional wiring construction has the problem of high on-resistance such as in the wiring from the transistor groups to the electrode terminals, if measures are applied to eliminate this problem, the integration density and other characteristics may be undermined.

It is an object of the present invention to provide a wiring structure for a high-current integrated circuit that can minimize the circuit's on-resistance without adversely affecting the integration density of the circuit.

It is another object of the present invention to provide a wiring structure for a high-current integrated circuit that can maximize the integration density of the circuit in the integrated circuit by space-efficient utilization of multiple wiring layers.

SUMMARY OF THE INVENTION

To achieve the above objectives, the present invention provides a wiring construction for a high-current integrated circuit, which construction utilizes unoccupied regions of certain wiring layers as space for routing other wiring layers, and incorporates overlapping-wiring construction between an electrode region and a wiring layer, or between wiring layers, without sacrificing other device characteristics.

According to one means of the invention, the wiring structure between transistor-electrode regions and the electrode terminals is such that, an output transistor has a first electrode region electrically connected to a first wiring layer forming the lower layer of a multilayer wiring construction. The first wiring layer is electrically connected to the first electrode region and the electrode terminal. A second wiring layer forming a portion of the upper layer of the multilayer wiring construction is electrically connected to a surface portion of the first wiring layer. A third wiring layer forming a portion of the lower layer of the multilayer construction is electrically connected to a second electrode region. A fourth wiring layer forming a portion of the upper layer of the multilayer wiring construction is electrically connected to the second electrode region on the output transistors via the third wiring layer. The fourth wiring layer passes over the portion of the first wiring layer formed away from the electrode terminal.

In the wiring structure as described above, because no second wiring layer is formed above the portion of the first wiring layer located away from the electrode terminal side, the required area for the wiring-layer-forming region is minimized. The fourth wiring layer is electrically connected to the second electrode region by means of an overlapping-wiring construction, wherein the fourth region passes through the unoccupied region above the portion of the first wiring layer located away from the electrode terminal side.

Furthermore, with such a wiring structure as described above, the on-resistance of a high-current integrated circuit can be minimized. Because a higher current flows into the region of the wiring layers located close to the electrode terminal than the region located far away from the electrode terminal, the current-carrying capacity of the integrated circuit is determined by the wiring construction in the region close to the electrode terminal. The present invention solves the current-concentration problem by providing additional wiring, i.e., the first wiring layer and the second wiring layer connected in parallel.

In a second means according to the present invention, the wiring structure between the transistor electrode regions and the electrode terminals is such that output transistors formed at the surface portions of the semiconductor regions have a first electrode region electrically connected to a first wiring layer constituting the lower layer of a multilayer-wiring construction, via connecting holes in the interlayer insulation films. A second electrode region of the transistor is electrically connected to a second wiring layer constituting a portion of the upper layer of the multilayer wiring construction, via connecting holes in the interlayer insulation films. In this wiring arrangement, the part of the interlayer insulation films above the second electrode region is not used as a region for the connecting holes which would otherwise connect the second wiring layer to the second electrode region. The first wiring layer is routed through this region of the insulation film over the second electrode region.

For a wiring construction employing the second means according to the present invention, space for the first wiring layer is provided by utilizing the space that would otherwise be used for the connecting holes connecting the second wiring layer to the second electrode region. A wiring construction of this type results in a minimized connection area, which would normally cause the current to become locally concentrated and increase the device on-resistance. However, the wiring construction according to the present invention minimizes the device on-resistance without adversely affecting other device characteristics.

Because the portion of the wiring structure near a first electrode terminal, to which the first wiring layer is electrically connected, is not used for forming connecting holes which would otherwise connect the second electrode region to the second wiring layer, the current through this region of the wiring construction is smaller than the current through other regions of the wiring. Consequently, the current through the portion of the wiring near the first electrode terminal does not significantly affect the overall device on-resistance, and the on-resistance of the circuit is minimized. Consequently, it is possible to maintain a high integration density, while simultaneously improving the permissible operating current of the integrated circuit. Furthermore, the device flatness can be maintained.

With the wiring structure according to a third means of the present invention, the wiring construction between the transistor electrode terminals and the transistor semiconductor regions is suitable for implementing a high-current integrated circuit which has n-phase, half-bridge circuits corresponding to each load with n pairs of transistors consisting of high-side and low-side transistors. The high-side transistors, which are applied with a high potential, and low-side transistors, which are applied with a low potential, form the transistor pairs for each phase. The high-side transistors and the low-side transistors form two parallel columns, and transistor pairs of each phase form a row. Output-wiring layers of each phase, which layers are equipped with output pads, are extended perpendicular to the transistor columns on the surface of the transistors. The output-wiring layers are electrically connected to an electrode region on one side of the high-side and low-side transistors of each phase. A high-side common terminal wiring layer and a low-side common terminal wiring layer, both of which layers are equipped with common terminal pads, are extended in parallel with the transistor columns and electrically connected to an electrode region on a second side of the corresponding transistors. The high-side common wiring layer, low-side common wiring layer, and output wiring layer form an overlapping, multilayer-wiring construction.

In this wiring structure where the third means of the present invention is utilized for connecting transistor regions with each wiring layer, the high-side transistors and the low-side transistors are arranged in a lattice-like configuration. The high-side common terminal wiring layer and the low-side common terminal wiring layer extending along the length of the respective transistor columns, and the output wiring layer extending perpendicular to the length of the transistor columns, form an overlapping multilayer-wiring construction which minimizes the required wiring distance. Consequently, a highly integrated wiring construction is possible, while simultaneously minimizing the on-resistance of the integrated circuit.

A fourth means according to the present invention incorporates a wiring construction between the transistor electrode terminals and the transistor regions, in which wiring construction the transistor pairs of each phase are formed in parallel. An output-wiring layer for each phase is positioned between the high-side and low-side transistors for the corresponding phase. One of a plurality of high-side common terminal wiring layers and one of a plurality of low-side common terminal wiring layers, each of which layers are equipped with a common terminal pad, to which the adjoining transistors are electrically connected, are arranged in parallel at the opposite ends of the device. The corresponding common terminal wiring layers are electrically connected to each other by wiring extending perpendicular to the length of the transistors, which forms an overlapping wiring construction in conjunction with other wiring layers.

In this construction, it is preferable for the common terminal pads and the output pads to be formed at the edge of each wiring layer and positioned at the outermost peripheries of the transistor-forming regions to facilitate a multi-pin construction. Furthermore, if the control circuits for controlling switching operations of the high-side and low-side transistors are formed on the same semiconductor substrate as these transistors, it is desirable for purposes of facilitating the multi-pin arrangement that the input/output pads in these control circuits are formed in regions adjoining the common terminal pads or the output pads.

In a wiring structure incorporating the fourth means according to the present invention, which means is suitable for implementing a half-bridge circuit, high-side transistors and low-side transistors are arranged in parallel, and a high-side common terminal wiring layer, a low-side common terminal wiring layer and an output wiring layer are electrically connected to the respective transistors. Among these wiring layers, the widely separated common-terminal-wiring layer pairs are electrically connected to each other, in addition to being connected to their respective transistors. By forming the various wiring layers in parallel and connecting the parallel layers with overlapping, connecting layers, the need for an extended, circuitous common-terminal wiring is obviated. Therefore, a device having this wiring construction benefits from minimized wiring resistance and device size. These effects in turn result in a reduced on-resistance of the integrated circuit, while simultaneously achieving a high integration density.

DETAILED DESCRIPTION OF PREFERRED EMBODIMENTS

The first embodiment is an example of wiring construction utilizing the first means according to the present invention. In this MOSFET construction, a source region 28 is connected to a power-source electrode terminal side, while a drain region 26 is connected to the output terminal side.

Figure 1:
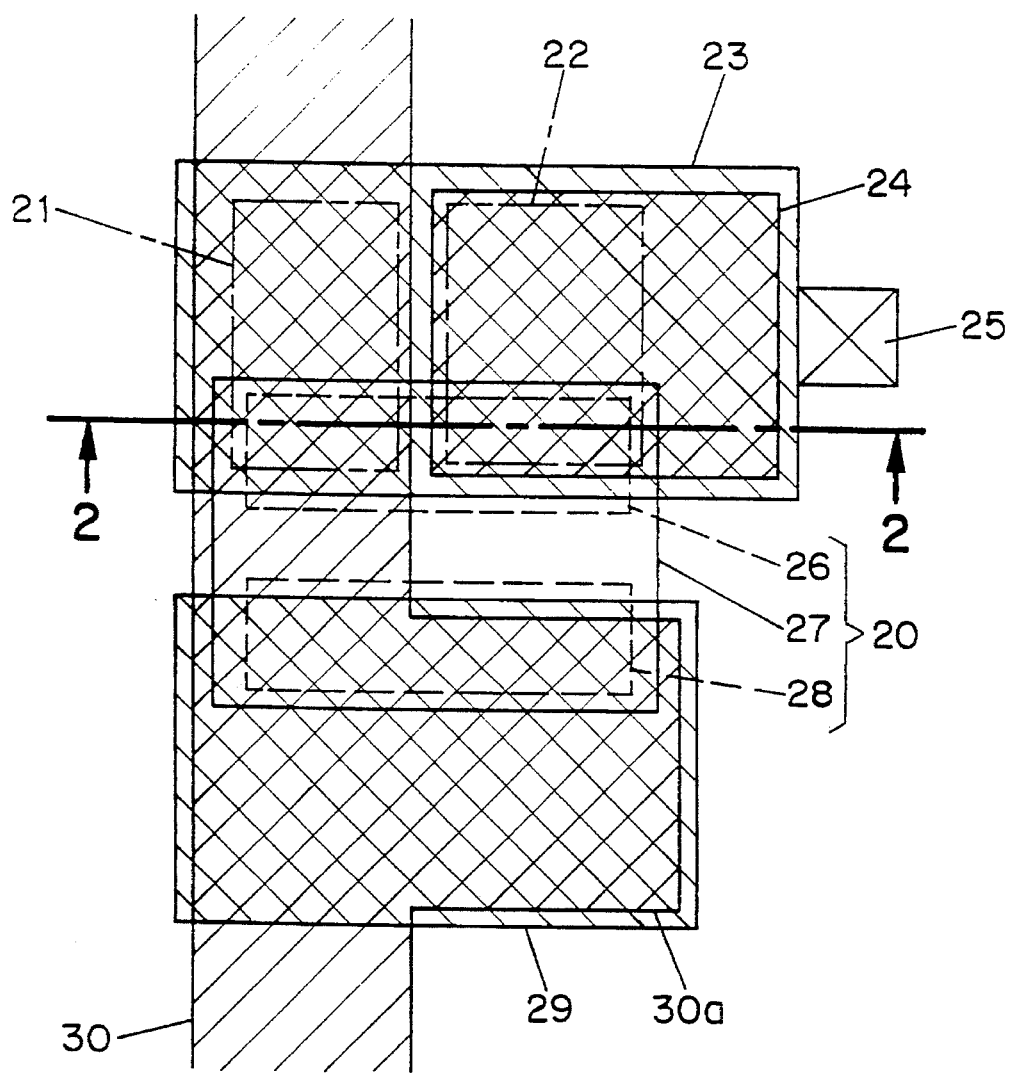
FIG. 1 is a plan view of a wiring construction for an output MOSFET according to a first embodiment of the present invention.
Figure 2:
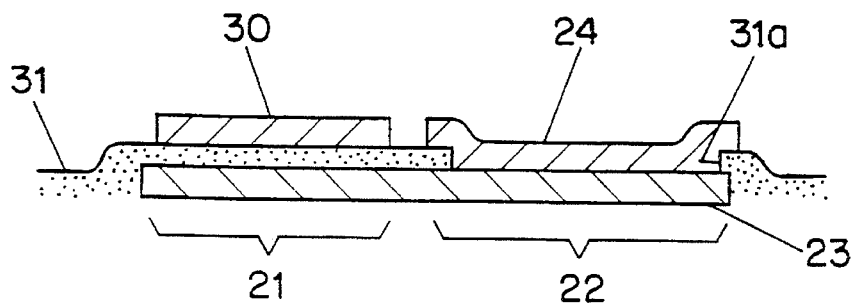
FIG. 2 is a cross-sectional view of the essential portions of the wiring construction for the high-current integrated circuit shown in FIG. 1.

In FIGS. 1 and 2, an output MOSFET 20 includes a first electrode region, the drain region 26, which is electrically connected to a first wiring layer, the output wiring layer 23, forming the lower layer of an aluminum-multilayer-wiring construction. The first wiring layer is electrically connected to the first electrode region via connecting holes (not shown) formed in interlayer insulation films 31, and the first output wiring layer 23 is also electrically connected to the electrode terminal 25. A second wiring layer 24, constituting the upper layer of the multilayer-wiring construction, is electrically connected to a first region 22 on the surface of the first output wiring layer 23 via a connecting hole 31a in the interlayer insulation film 31, as shown in FIG. 2. Consequently, the first region 22 of the drain region 26 is located close to the electrode terminal 25, and the second output wiring layer 24 is also electrically connected close to the electrode terminal 25.

In a MOSFET of this construction, the first region 22 is electrically connected in parallel to the electrode terminal 25 by the first output wiring layer 23 and the second wiring layer 24. In contrast, a second region 21 of the drain regions 26, which second region is located far from the electrode terminal 25, is electrically connected to the electrode terminal 25 via only the first output wiring layer 23. The region above the second region 21 is free of the second output wiring layer 24. Furthermore, a second electrode region, a source region 28, is electrically connected to a third wiring layer, a first power-source-wiring layer 29, forming a portion of the lower layer of the multilayer wiring construction. The third wiring layer is electrically connected to the second electrode region via connecting holes in the interlayer insulation films. Also, a fourth wiring layer, a second power-source-wiring layer 30, forming a portion of the upper layer of the multilayer wiring construction, is disposed on the surface of the first power-source-wiring layer 29. The layer 30, having a protrusion 30a, is electrically connected to the layer 29 via the connecting holes in the interlayer insulation films 31. The layer 30 extends to the power-source terminal side.

In this construction, the second power source wiring layer 30 passes through a region directly over the second region 21 of the drain region 26, as shown in FIG. 2. The second power-source-wiring layer 30 and the first output-wiring layer 23 form an overlapping wiring construction with the interlayer insulation films 31 interposed between the two layers. Each wiring layer 23, 24, 29, and 30 is formed within the boundaries of the output-MOSFET-forming region for the MOSFET 20, and does not extend unnecessarily beyond the region. Consequently, a high integration density can be realized for the integrated circuit.

Furthermore, the on-resistance of an integrated circuit having this wiring construction is minimized. Because the first region 22, electrically connected to the electrode terminal 25 by means of a double-wiring construction, is located closer to the electrode terminal 25 than the second region 21 is located from the terminal 25, the resulting current flow through the region 22 is relatively greater than the current flow through the region 21. This disparity in current flow results from the fact that the current through the second region 21 represents only a portion of the total source-to-drain current. In contrast, the current flow through the region 22 is close to the total source-to-drain current. Because the current flow through the first region 22 is significantly greater than the current flow through the second region 21, the on-resistance due to the wiring resistance in this output MOSFET is determined largely by the wiring resistance of portions of the first and second output wiring layers 23 and 24 extending between the first region 22 and the electrode terminal 25.

Alternatively, if the second output-wiring layer 24 is formed directly above the second region 21, the available space for the output wiring layer 30 is restricted, thereby making it necessary to construct the output wiring layer 30 around the layer 24. In contrast to this alternative, the first embodiment of the present invention incorporates a double wiring construction which enables an overlapping-wiring construction, by providing a region free of the second output wiring layer 24 directly above the first region 21 of the drain region 26. Therefore, a low on-resistance for the circuit is possible without adversely affecting the integration density of the circuit. Moreover, the distance of the protrusion 30a is minimized, which in turn minimizes the wiring resistance and the overall on-resistance of the integrated circuit.

Figure 3A:
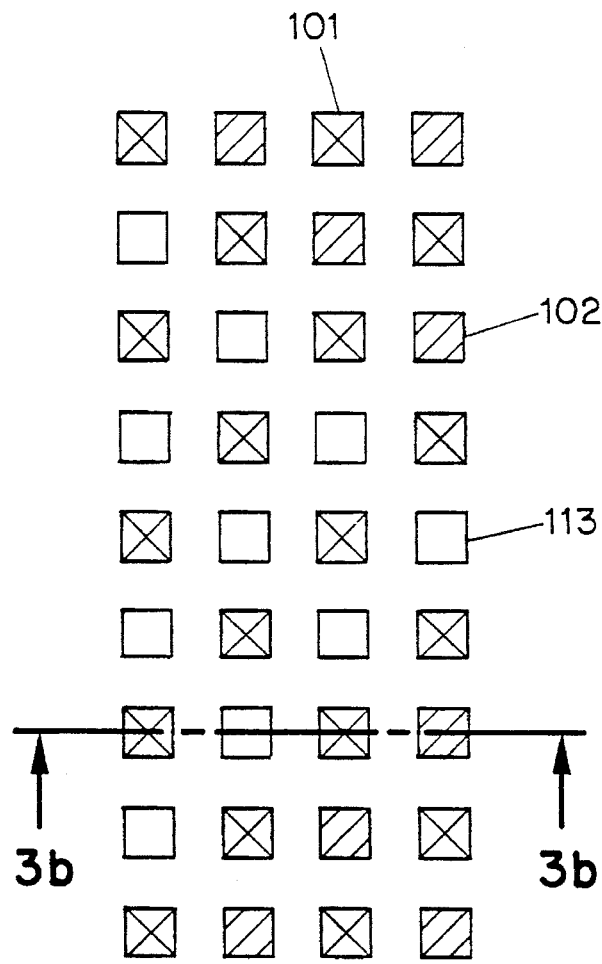
FIG. 3(a) is a plan view of a wiring construction for an output MOSFET according to a second embodiment of the present invention.
Figure 3B:
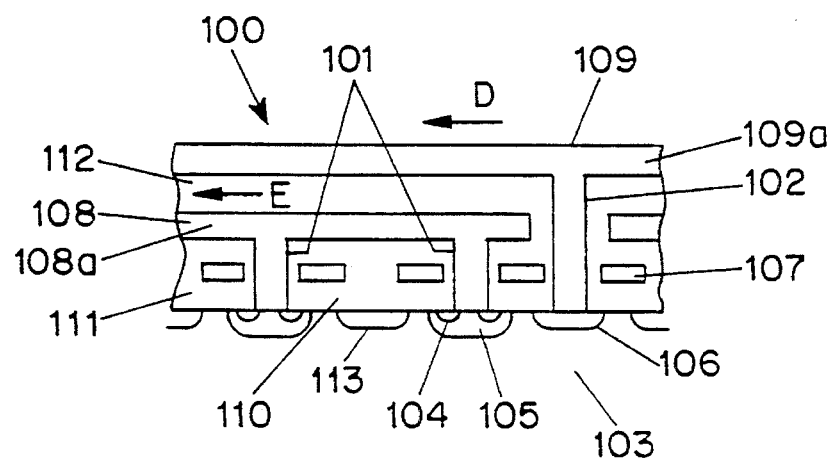
FIG. 3(b) is a cross-sectional view of the wiring construction shown in FIG. 3(a) taken along the line b—b in FIG. 3(a)

The second embodiment is an example of a wiring construction utilizing the second means according to the present invention. FIGS. 3(a) and 3(b) show FET cells of a DMOS construction having $n^+$-type source regions 104 which serve as the first electrode regions and are formed inside p-type base layers 105, drain regions 106 serving as the second electrode regions, and gate electrode layers 107. The various regions and layers are arranged in a lattice-like construction on the surface of a semiconductor region 103. In these FET cells, a source-wiring layer 108 serving as the first wiring layer is formed on the surface of the first interlayer insulation films 111, and the layer 108 is electrically connected to predetermined source regions 104 via source connecting holes 101. Furthermore, a drain wiring layer 109 serving as the second wiring layer is formed on a second interlayer insulation film 112, and the layer 109 is electrically connected to predetermined drain regions 106 via a drain connecting hole 102, thereby completing the output MOSFET 100.

In a MOSFET of this structure, the current between the source and the drain in the output MOSFET 100 flows in the direction of arrow D on the drain wiring layer 109, and the current flows in the direction of arrow E from the source wiring layer 108 through the drain connecting hole 102, the drain regions 106, the source regions 104, and the source connecting holes 101. Therefore, the current tends to concentrate on the electrode terminal side 109a within the drain wiring layer 109, and on the electrode terminal side 108a within the source wiring layer 108.

Despite the disparate current concentrations in this embodiment, the density of wiring connections to each FET cell from the drain wiring layer 109 and the source wiring layer 108 of the output MOSFET 100 is distributed in such a way that the on-resistance due to the disparate current concentrations can be minimized. On the electrode terminal side 109a of the drain wiring layer 109, which side 109a is the region on the right in FIG. 3(a), the formation density of the drain connecting hole 102 is made relatively higher than that of the side opposite the electrode terminal side 109a. This is accomplished by distributing, in a predetermined pattern, the unconnected drain regions 113 for which no connecting hole for the interlayer insulation film is formed. At the same time, on the electrode terminal side 108a in the source wiring layer 108, which side 108a is the region on the left in FIG. 3(a), the formation density for the source connecting holes 101 is made relatively higher than that of the side opposite the side 108a. With this density distribution of connecting holes 101 and 102, the wiring resistance attributable to the wiring layers of the high-current regions can be minimized.

In a MOSFET of this structure, patterning of the source wiring layer 108 must take into account the location of the drain connecting hole 102; however, no patterning restrictions arise from the unconnected drain region 113. Consequently, the integration density of the device is maximized without significant increase in the on-resistance.

Figure 4A:
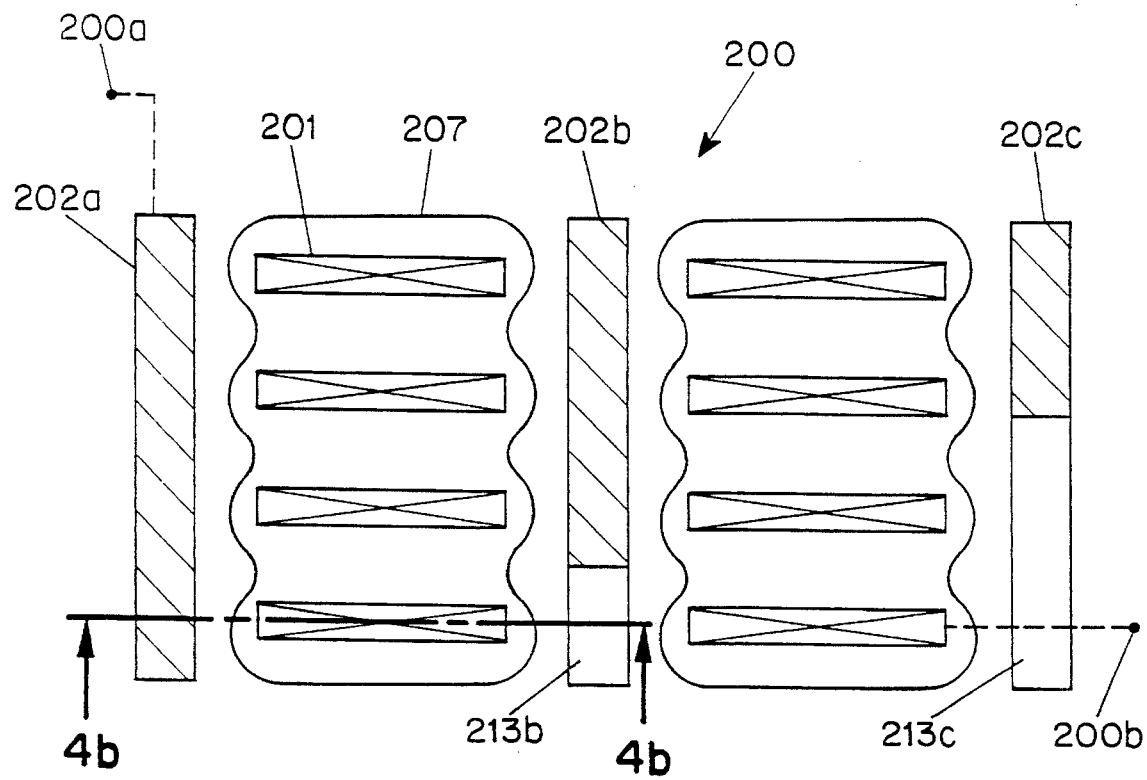
FIG. 4(a) is a plan view showing the wiring construction for an output MOSFET according to a third embodiment of the present invention.
Figure 4B:
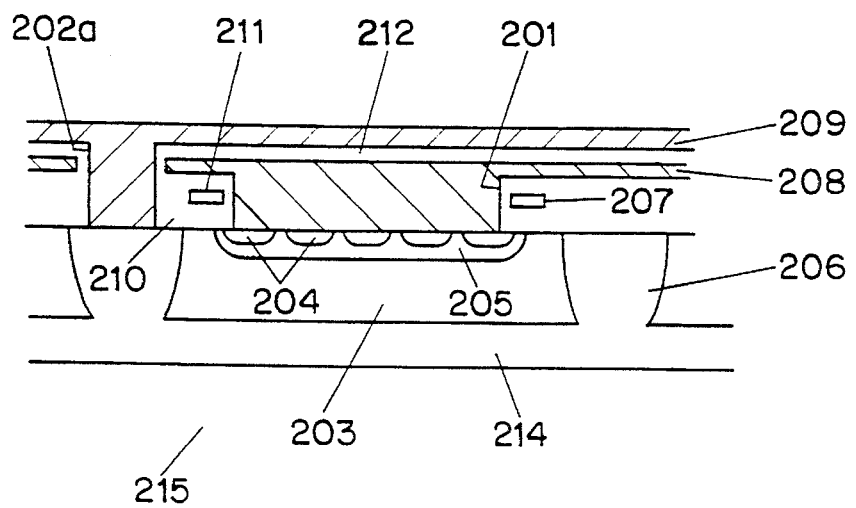
FIG. 4(b) is a cross section along the line b—b in FIG. 4(a)

The wiring construction which optimizes the integration density of an integrated circuit, as in the output MOSFET of the second embodiment, can also be applied to a MOSFET with the "stripe-and-source" construction as shown in FIGS. 4(a) and 4(b). The MOSFET shown in these FIGURES consists of a p-type semiconductor substrate 215, an n$^+$-type embedded layer 214, an epitaxially-formed, island-like n-type region 203 formed on the embedded layer 214, a p-type base layer 205 formed on the surface of the region 203, stripe-type n-type source regions 204 serving as the first electrode region formed in the surface portion of the layer 205, n$^+$-type drain regions 206 serving as the second electrode region, and the gate electrode layer 207.

Above these regions, a source-wiring layer 208 serving as the first wiring layer and constituting the lower layer of the multilayer wiring construction is formed. A first interlayer-insulation film 210 is formed to the sides of the layer 208. The source-wiring layer 208 is electrically connected to the source region 204 via a source connecting hole 201 in the first interlayer-insulation film 210. Directly above the layer 208, a second interlayer-insulation film 212 is formed. On the surface of the insulation film 212 a drain wiring layer 209, serving as the second wiring layer and constituting the upper layer of the multilayer wiring construction, is formed. The drain wiring layer 209 is electrically connected to the drain region 206 via drain connecting holes 202a, 202b, and 202c formed in the first interlayer-insulation film 210 and the second interlayer-insulation film 212.

The MOSFET's so constructed are integrated to form the output MOSFET 200, shown in FIG. 4(a), for a high-current integrated circuit, part of which MOSFET is shown in FIG. 4(b). In this output MOSFET 200, an electrode terminal 200a on the drain side is provided on the upper left side in FIG. 4(a), and another electrode terminal 200b on the source side is provided on the lower right side in FIG. 4(a). In a device of this arrangement, the current flows from top to bottom and from left to right of FIG. 4(a). Therefore, the construction is such that a high current concentrates on the upper left side of the drain wiring layer 209, and the lower right side of the source wiring layer 208. In other words, the high-current regions of the circuit are the regions in which the electrode terminals 200a and 200b are formed.

In order to provide appropriate wiring connections corresponding to this current distribution, in the wiring construction of the drain wiring layer 209 and the drain region 206, the size of the opening area of the drain connecting holes 202b and 202c is made to be smaller than that of the drain connecting hole 202a, whereby all the drain-connecting-hole openings are opened and shifted to the side of the electrode terminal 200a. In the region close to the electrode terminal 200a, a sufficiently large contact region is provided whereby the drain region 206 is electrically connected directly to the drain wiring layer 209. In contrast, on the other side, i.e., the right side of FIGS. 4(a) and 4(b), the free regions 213b and 213c of the drain-connecting holes on the drain layer surface are not connected to the drain.

In this example, the free regions of the drain connecting holes 202b and 202c, i.e., the space which would otherwise be used for these connecting holes, are utilized in such a manner that the source wiring layer 208 is extended past and above the drain region 206. In addition, in the vicinity of the electrode terminal 200b, the space available for the pattern of the source-wiring layer 208 is expanded. Therefore, despite the drain wiring layer 209 and the source wiring layer 208 being located in a highly integrated circuitry, because sufficient space is available for drain and source wiring patterns on the side of the electrode terminals 200a and 200b, the on-resistance is minimized. Consequently, the permissible current in the integrated circuit is increased even though the current is concentrated on the electrode terminal sides 200a and 200b on the drain wiring layer 209 and the source wiring layer 208. Furthermore, because the current directly below the free regions 213b and 213c of the drain-connecting holes flows into the drain wiring layer 209 through the drain region 206, each of the parts of the MOSFET's functions as an individual FET. As a result, incorporating free regions 213b and 213c in this wiring construction does not adversely affect the MOSFET characteristics.

Figure 5:
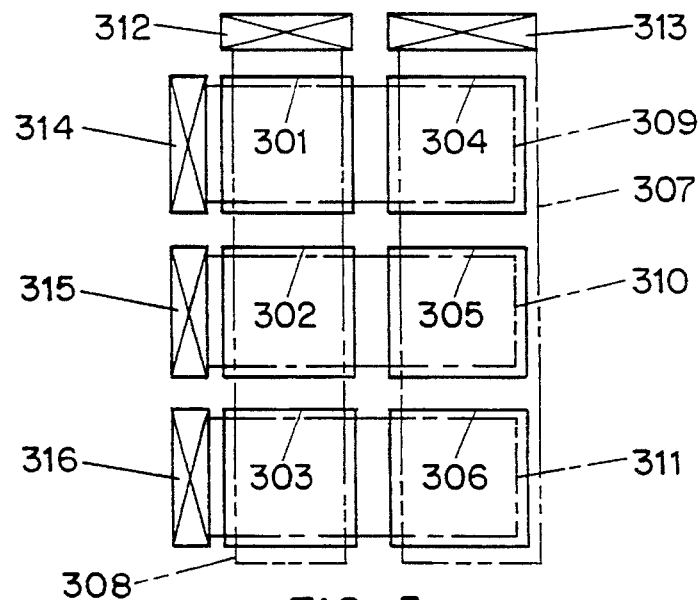
FIG. 5 is a plan view showing the wiring construction for a high-current integrated circuit according to a fourth embodiment of the present invention.
Figure 9:
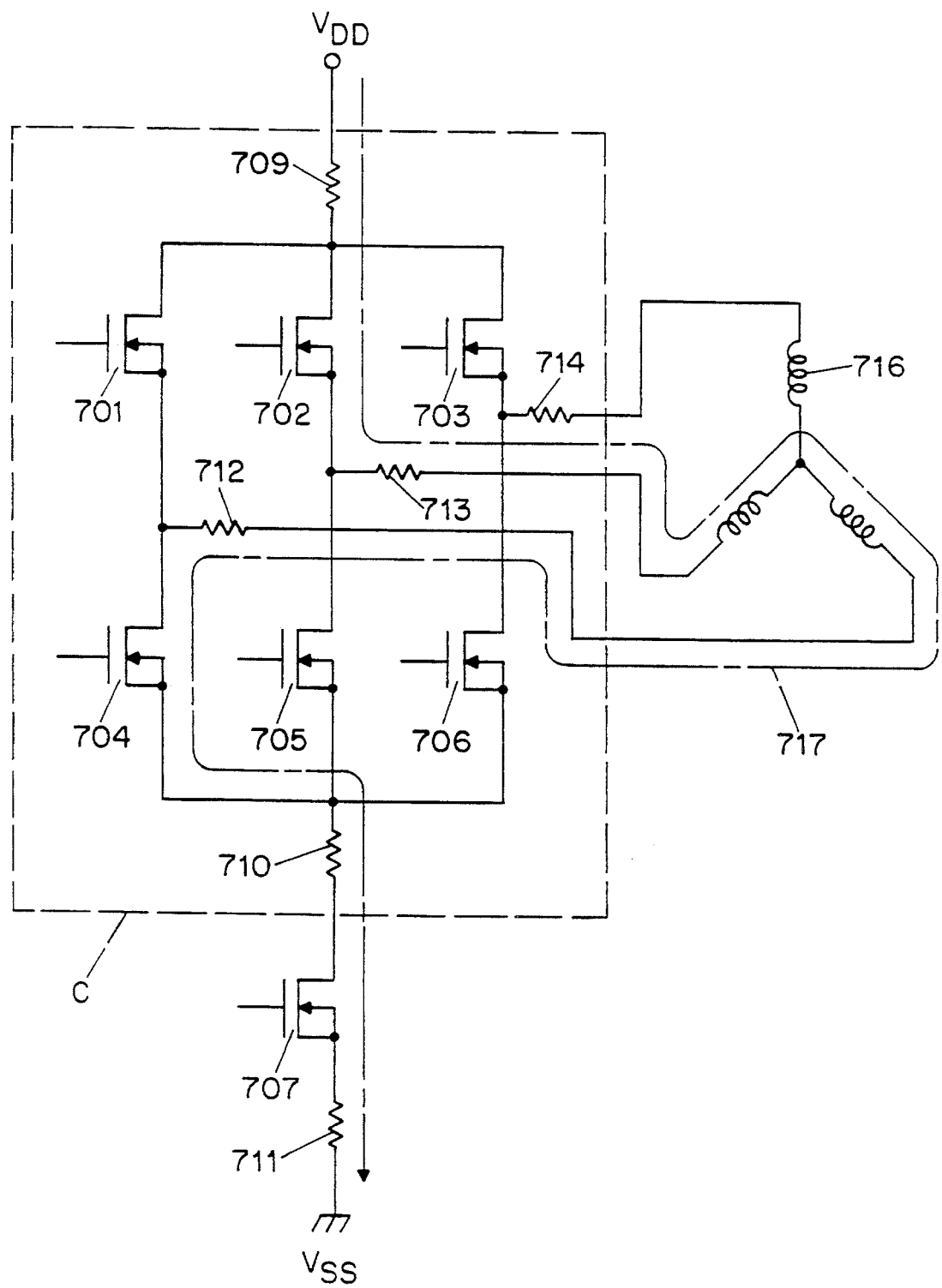
FIG. 9 is a circuit diagram of a high-current integrated circuit with a half-bridge circuit.
Figure 10:
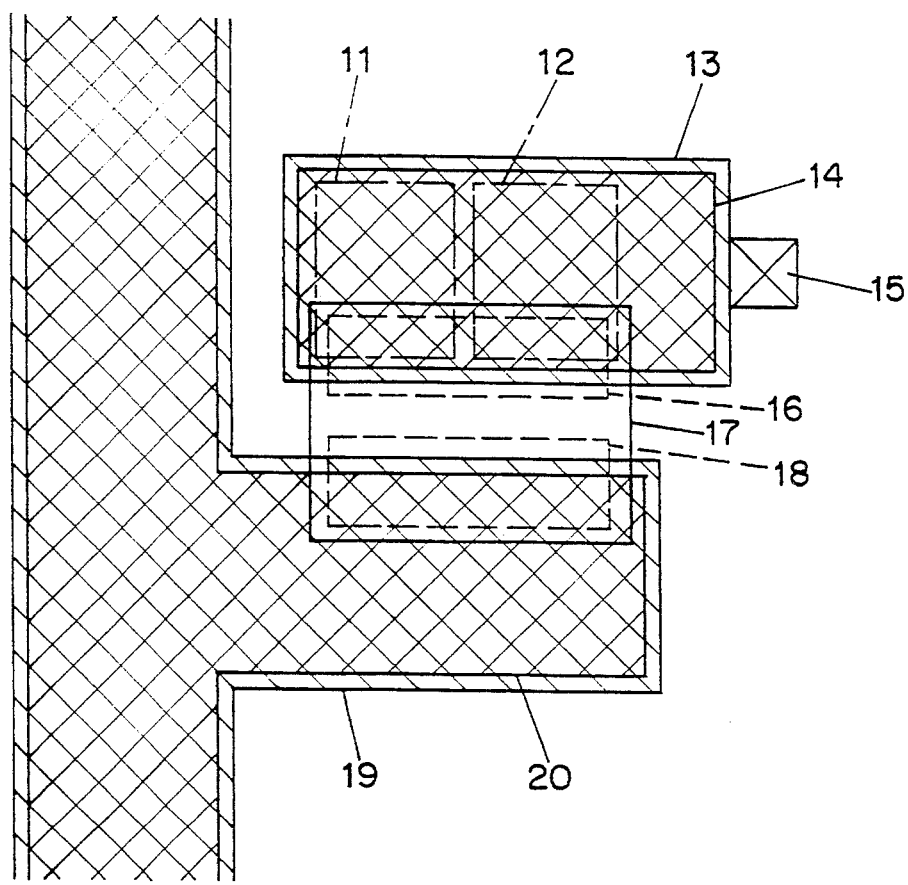
FIG. 10 is a plan view showing the wiring construction of a conventional output MOSFET.
Figure 11A:
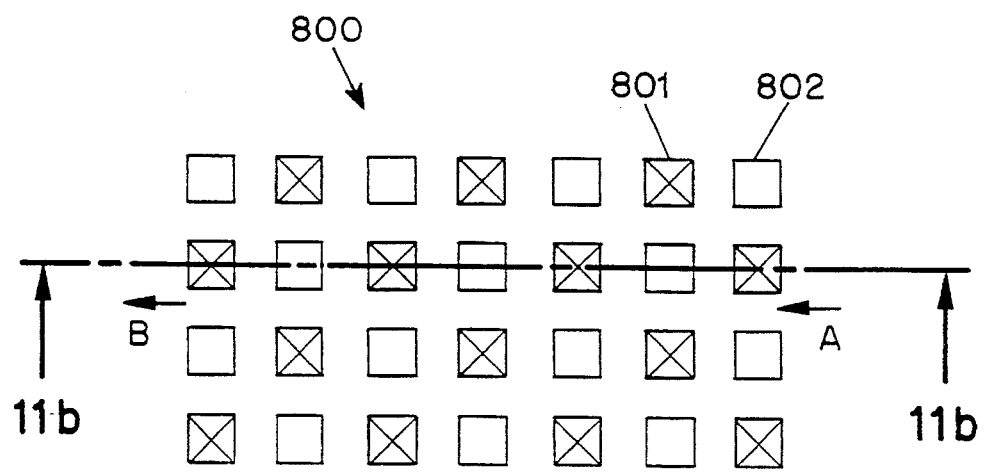
FIG. 11(a) is a plan view showing the wiring construction for another conventional output MOSFET.
Figure 11B:
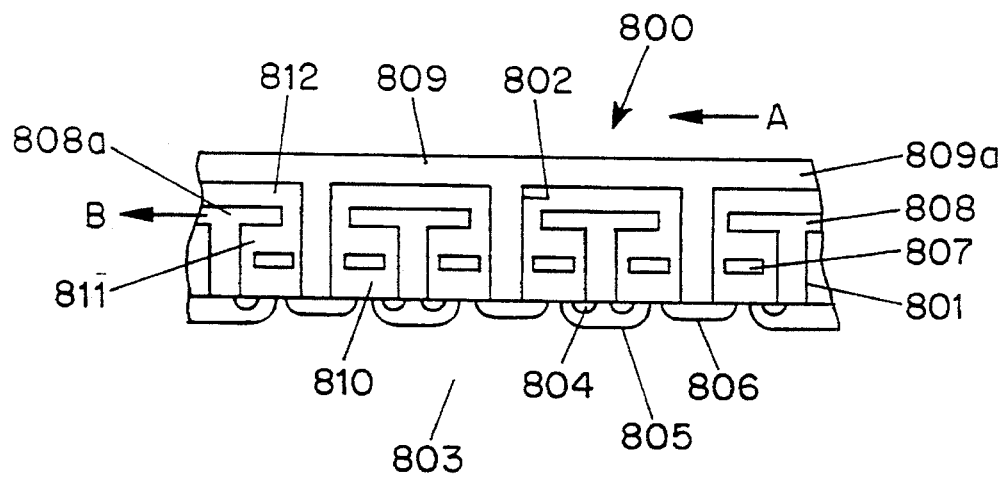
FIG. 11(b) is a cross section along the line b—b in FIG. 11(a)

Next, a fourth embodiment of the wiring construction in a high-current integrated circuit according to the present invention is explained. The fourth embodiment is an example of the wiring construction utilizing the third means according to the present invention. FIG. 5 is a plan view of a high-current circuit incorporating an aluminum multi-layer wiring construction according to the fourth embodiment of the present invention, in the circuit represented by FIG. 9, for example. As shown in FIG. 5, the high-side transistors 301–303, arranged in a column, are paired with the low-side transistors 304–306, also arranged in a column, respectively, such that the transistor pairs for the respective phases form a row.

In addition, the first-phase output wiring layer 309 is electrically connected via connecting holes in the interlayer-insulation films to the source-electrode region on a first side of the first-phase, high-side transistor 301. The layer 309 is also connected to the drain-electrode region on one side of the first-phase, low-side transistor 304, and one edge of the layer 309 is connected to a first-phase output pad 314. Similarly, the second and third-phase output wiring layers 310 and 311 are electrically connected to the source-electrode region on a first side of the second and third-phase, high-side transistors 302 and 303, respectively, and to the drain-electrode region on a first side of the low-side transistors 305 and 306. One edge of each of the layers 310 and 311 is connected to the first-phase output pad 315 and the second-phase output pad 316, respectively.

In the construction shown in FIG. 5, each output wiring layer 309–311 forms the lower layer of the multilayer wiring construction. The high-side common terminal wiring layer 308, extending along the length of the high-side-transistor column, is electrically connected to the source-electrode region on a second side of each high-side transistor 301–303 via the connecting holes in the interlayer insulation film. The edge of layer 308 is connected to a high-side common terminal pad 312. Similarly, the low-side common terminal wiring layer 307, extending along the length of the low-side-transistor column, is electrically connected to the drain-electrode region on a second side of each low-side transistor 304–306. The edge of layer 307 is connected to a low-side common terminal pad 313. Each common terminal wiring layer 307 and 308 forms a portion of the upper layer of the multilayer wiring construction. Consequently, the wiring layers forming the upper and lower layers of the multilayer wiring construction are configured in an overlapping arrangement.

As described above, in this embodiment, each transistor 301–306 is arranged in a lattice-like configuration in two columns. The output-wiring layers 309–311, arranged perpendicular to the transistor columns, and the common-terminal-wiring layers 307 and 308, arranged along the length of the transistor columns, are electrically connected to the transistors 301–306. By incorporating this wiring configuration, rather than arranging each transistor 301–306 in parallel as in the wiring construction shown in FIG. 12, the distance required for the wiring layers 307–311 is reduced. Consequently, the overall wiring resistance and on-resistance of the circuit is minimized.

With the wiring construction of FIG. 5, several problems associated with conventional wiring configurations are avoided. First, one can avoid the problem of having to increase the wiring layer thickness in order to reduce wiring resistance. Also avoided are the increase in production time and cost associated with an increase in the wiring-layer thickness and width necessary for reducing wiring resistance. Furthermore, increase in chip area, or problems attributable to increased distance between the scribe lines and pads, are eliminated.

Figure 6:
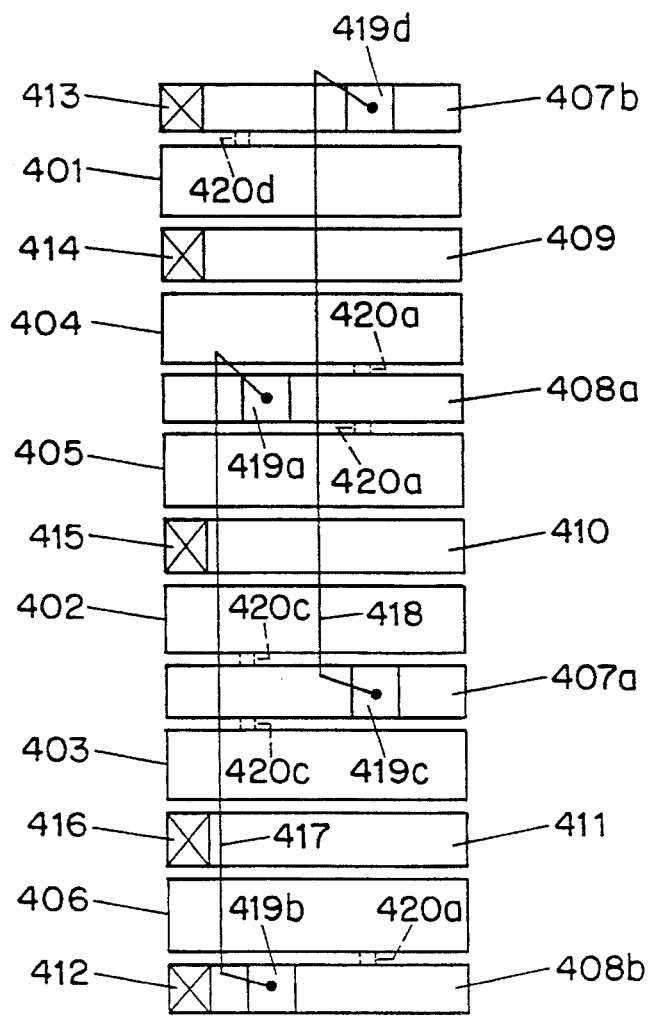
FIG. 6 is a plan view showing the wiring construction for a high-current integrated circuit according to a fifth embodiment of the present invention.

Next, a wiring construction according to a fifth embodiment of the present invention incorporating a parallel-arrangement construction for the transistor shown in FIG. 2 is explained. The fifth embodiment is an example of the wiring construction utilizing the fourth means according to the present invention. As shown in FIG. 6, the first-phase output wiring layer 409 is arranged in parallel between the first-phase, low-side transistor 401 and the first-phase, high-side transistor 404. Similarly, the second-phase output wiring layer 410 is arranged in parallel between the second-phase, low-side transistor 402 and the second-phase, high-side transistor 405. The third-phase output wiring layer 411 is arranged in parallel between the third-phase, low-side transistor 403 and the third-phase, high-side transistor 406. Each transistor 401–406 is arranged in such an order that the adjoining low-side or high-side transistors are arranged opposite each other.

The power-source-wiring layer 408a, serving as the high-side common wiring layer, having a connecting pad 419a, is arranged between the first-phase, high-side transistor 404 and the second-phase, high-side transistor 405. The power source wiring layer 408b having a connecting pad 419b and a power-source pad 412 is arranged in a position adjoining the third-phase, high-side transistor 406. Similarly, the low-side common terminal wiring layer 407a having a connecting pad 419c is arranged between the second-phase, low-side transistor 402 and the third-phase, low-side transistor 403. The low-side common terminal wiring layer 407b, having a connecting pad 419d and a low-side common terminal pad 413, is arranged in the position adjoining the first-phase, low-side transistor 401. The power source wiring layers 408a and 408b, and each high-side transistor 404–406, are electrically connected by the connecting wiring layers 420a and 420b, shown by the broken lines. Similarly, the low-side common wiring layers 407a and 407b, and the high-side transistors 404–406, are electrically connected by the connecting wiring layers 420c and 420d, shown by the broken lines.

Figure 12:
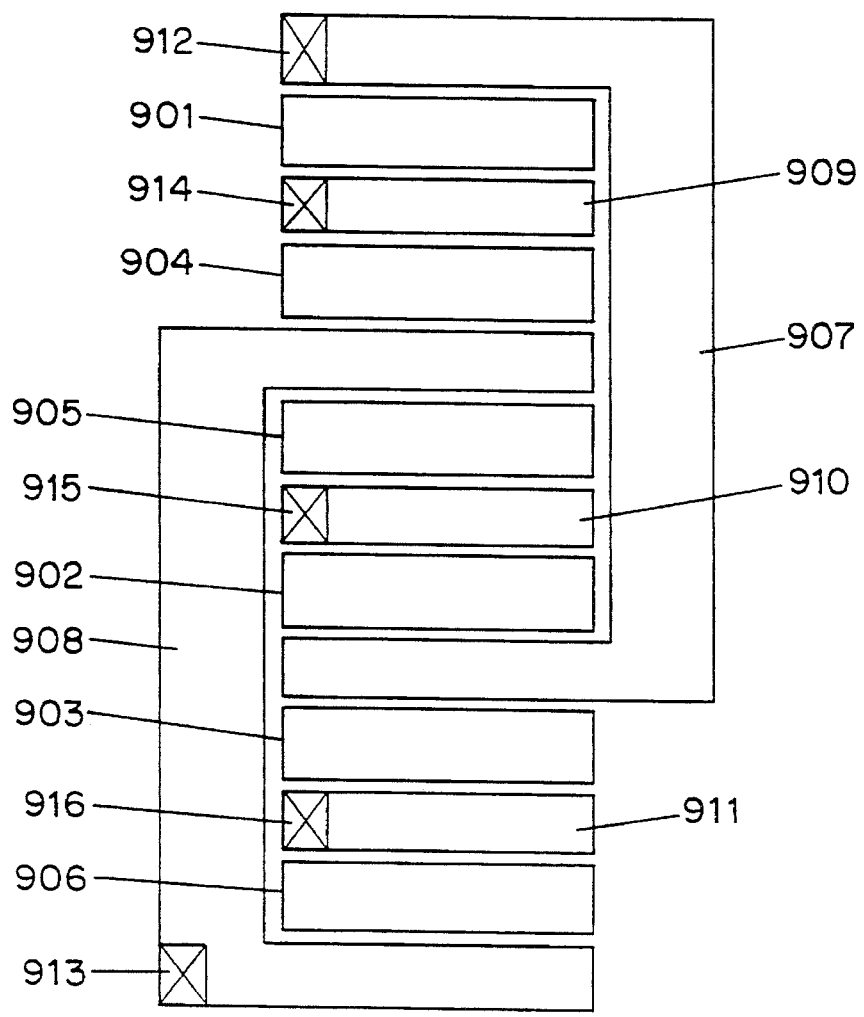
FIG. 12 is a plan view showing a wiring construction for a conventional high-current integrated circuit.

In this example, which differs from the conventional example shown in FIG. 12, the power-source wiring layers 408a and 408b, and the low-side common terminal wiring layers 407a and 407b, are not configured to surround the regions forming the transistors 401–406. Rather, the layers 407a, 407b, 408a and 408b are arranged in parallel with the transistors 401–406. Moreover, the widely separated power-source-wiring layers 408a and 408b are electrically connected to each other by the power source wiring wire 417 extending between the wiring layers' respective connecting pads 419a and 419b. Similarly, the low-side common terminal wiring layers 407a and 407b are electrically connected to each other by the low-side common terminal wiring wire 418 extending between the wiring layers' respective connecting pads 419c and 419d. Consequently, the wiring layers and the power source wiring wire 417 are configured in an overlapping wiring construction. Therefore, increase in the wiring resistance, which results from the circuitous connections of the power-source-wiring layers and the low-side common terminal wiring as shown in FIG. 12, is avoided.

In addition, employing the wiring construction of FIG. 6, which enables free selection of the resistance value, allows a reduction in the wiring resistance as well as in the on-resistance. Because the output pads 414–416 of each phase formed in the corresponding output wiring layers 409–411, the power-source pad 412 formed in the power source wiring layer 408b, and the low-side common terminal pad 413 formed in the low-side common terminal wiring 407b are all arranged along the outermost peripheries of the semiconductor chip, it is possible to minimize the wiring distance for a multi-pin semiconductor chip. In addition, because the output pads 414–416, the power source pad 412 and the low-side common terminal pad 413 are spaced at prescribed intervals, the wiring construction of FIG. 6 is particularly suitable for multi-pin semiconductor chips.

Figure 7:
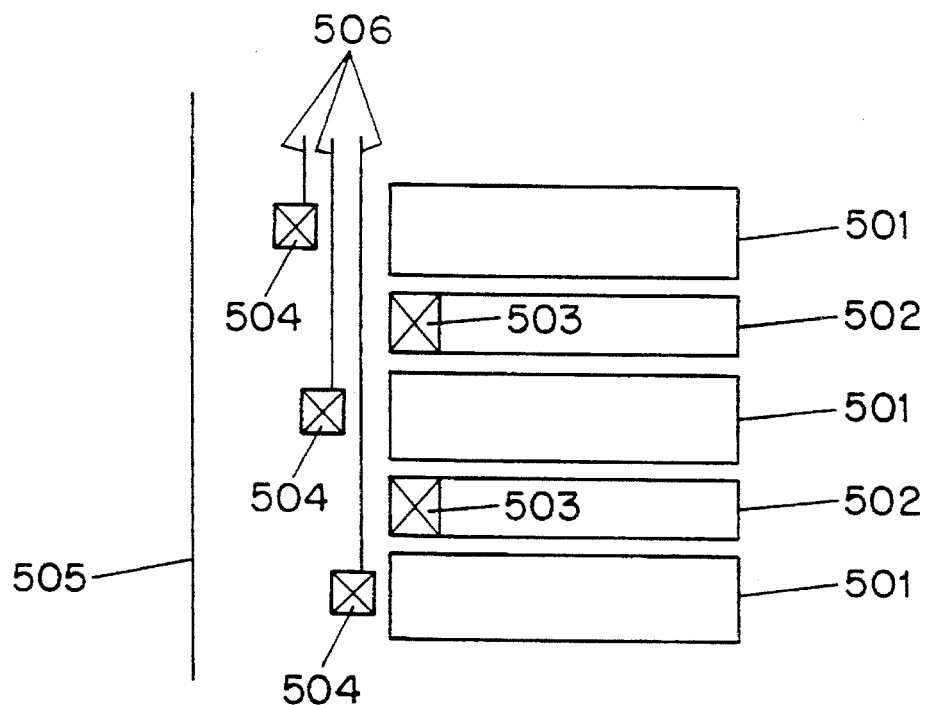
FIG. 7 is a plan view showing part of the wiring construction for a high-current integrated circuit according to a sixth embodiment of the present invention.

FIG. 7 is a plan view of the wiring construction of a high-current output integrated circuit according to the sixth embodiment of the present invention. An explanation is provided for the sixth embodiment of the present invention utilizing the wiring construction used in either the fourth embodiment or the fifth embodiment, with emphasis on the positional relationship of various pads in a high-current output circuit, which consists of a driving section formed on a semiconductor chip and a theoretical control circuit for the driving section, which control circuit is not shown.

As shown in FIG. 7, in this embodiment the transistors 501 of each phase are arranged in parallel with the output wiring layers 502 of each phase interposed between the transistors. As a result of utilizing the wiring construction shown in the fourth embodiment or the fifth embodiment in such a device as shown in the sixth embodiment, which is configured to operate as a full bridge circuit, no power-source-wiring layers are provided around the output transistors. Rather, the output pads 503 for each output wiring layer 502 are formed on one side of the layer 502. In addition, relative to the theoretical control circuit that controls these transistor circuits, the control-circuit-input/output pads 504, which are electrically connected to one another via the control-circuit wiring 506 made of polysilicon, are arranged such that each pad 504 adjoins an output pad 503. The output pads 503 and the control-circuit-input/output pads 504 are formed on one side of the chip edge 505.

In this type of wiring structure, which employs the wiring construction of either the fourth or fifth embodiment, since no power-source-wiring layer or low-side common terminal wiring is provided around the output transistors 501 as in the conventional wiring construction shown in FIG. 12, no restriction is placed on the location of the control-circuit-input/output pads 504, although these pads are optimally arranged close to the chip edge 505. Consequently, this construction allows the required wiring distance to be minimized for multi-pin semiconductor devices.

Figure 8:
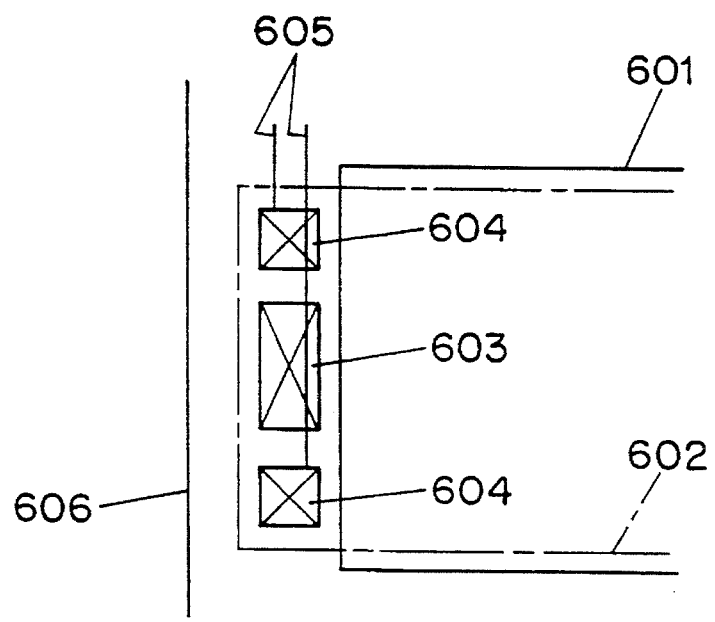
FIG. 8 is a plan view showing part of the wiring construction for a high-current integrated circuit according to a seventh embodiment of the present invention.

A seventh embodiment of the present invention incorporates a wiring construction in which an output pad and a control-circuit input/output pad are arranged in a series. This example, as in the fourth or fifth embodiment, also utilizes a construction in which no power-source-wiring layer or low-side common terminal wiring is provided around the transistor regions. FIG. 8 is a plan view of the wiring construction for a high-current integrated circuit according to the seventh embodiment. An output-wiring layer 602, which constitutes the lower layer of the multilayer wiring construction, is formed on the surface of the output transistor 601. In addition, an output pad 603 is formed at the edge of the output-wiring layer 602, and control-circuit input pads 604, electrically connected to a control-circuit, which is not shown, are provided on both sides of the output pad 603.

In the wiring construction of this structure, which utilizes the wiring construction of the fourth or fifth embodiment, no restriction is placed on the locations of the control section input pads 604 because no power-source-wiring layer is provided around the output transistor 601. In turn, the control-circuit input pads 604 and the output pad 603 can be arranged close to the chip edge 606. As a result, this construction allows the wiring distance to be minimized in multi-pin semiconductor devices.

In all of the illustrated embodiments, reduction of the on-resistance in a high-current integrated circuit becomes possible because the parasitic resistance which restricts the wiring layers is reduced, and the permissible operating current can be increased. The present invention accomplishes these results by incorporating a double-wiring construction only in the electrode terminal side of the electrode region, to which electrode terminal the first wiring layer is electrically connected, and by forming an overlapping-wiring construction utilizing the unoccupied or free region above the portion of the electrode region formed away from the electrode terminal. Therefore, the present invention simultaneously facilitates an overlapping-wiring construction and minimization of the device on-resistance attributable to a current concentration, by providing a double-wiring construction only in the high-current region. Hence, the on-resistance attributable to the wiring layers of the integrated circuit can be minimized without impairing the high integration density of the device.

Alternatively, in the second means according to the present invention, the first wiring layer occupies a region of the device that would conventionally be used for the connecting holes which connect the second wiring layer to the second electrode region on the side of the electrode terminal for the first wiring layer, to which electrode terminal the first wiring layer is electrically connected. Utilizing this wiring arrangement allows the on-resistance of the transistor circuit to be minimized without sacrificing the integration density, and the permissible operating current in the integrated circuit can be increased.

Another wiring arrangement of the present invention, which arrangement is suitable for implementing a half-bridge circuit, entails arranging the high-side transistors and the low-side transistors in a lattice-like configuration, to which transistors the common-terminal-wiring layers having an overlapping-wiring construction and the output-wiring layers are electrically connected. With this construction, the required wiring distance can be minimized, thereby enabling a reduction in the wiring resistance and an improvement in the integration density.

Another alternative wiring configuration according to the present invention involves arranging the common-terminal-wiring layers and the output-wiring layers, which are electrically connected to the transistors, in parallel. The two common-terminal-wiring layers, which are distantly arranged, are electrically connected to each other by wires, thereby obviating any need for an extended, circuitous configuration of the wiring layers.

This wiring arrangement minimizes the on-resistance of the device while maintaining high integration density. For a device having input/output pads of the control circuit formed in the regions adjoining the common terminal pads and the output pads, this construction additionally enables the common terminal pads and the output pads to be formed on the edges of the wiring layers and along the outermost peripheries of the transistor pairs. With this type of an arrangement, bonding wires can be arranged in a very reliable manner, thereby resulting in improved reliability of the high-current integrated circuit.

While the present invention has been described with reference to preferred embodiments, it will be appreciated by those skilled in the art that the invention is not so limited. Variations include, e.g., wiring constructions combining any one of the first through third embodiments with the fourth or fifth embodiment, as well as wiring constructions combining any one of the first through fifth embodiments with the sixth or seventh embodiment.

We claim:

1. A multilayer wiring structure for a high-current integrated-circuit device having first and second semiconductor surface electrode regions, comprising:

a first lower wiring layer at least in part on at least a portion of the first electrode region;

an electrode terminal electroconductively connected to the first lower wiring layer;

a first upper wiring layer on a first portion of the first lower wiring layer adjacent to the electrode terminal;

an insulating layer on a second portion of the first lower wiring layer;

a second lower wiring layer at least in part on at least a portion of the second electrode region;

a second upper wiring layer in part on the insulating layer and in part on the second lower wiring layer.

2. A multilayer wiring structure for a high-current integrated-circuit device having first and second semiconductor surface electrode regions, comprising:

first and second wiring layers and an insulation layer in part between the semiconductor surface and the first wiring layer, in part between the semiconductor surface and the second wiring layer, and in part between the first and second wiring layers, the first wiring layer being disposed between the semiconductor surface and the second wiring layer;

first and second wiring connectors, electroconductively connecting respective first and second electrode regions to the first and second wiring layers via channels in the insulation layer, at least one of the second electrode regions being unconnected, and the first layer extending over the at least one unconnected second electrode region.

3. A multilayer wiring structure for a high-current integrated circuit device of n-phase, half-bridge circuit structure, having n pairs of high-side and low-side transistor regions, comprising:

a plurality of high-side transistors having multiple electrode regions, the number of transistors corresponding to the number of phases, the high-side transistors being arranged in a column;

a plurality of low-side transistors having multiple electrode regions, the number of transistors corresponding to the number of phases, the low-side transistors being arranged in a column extending parallel to the high-side transistor column;

a plurality of output wiring layers corresponding to the number of phases, the output wiring layers being provided with output pads, the output wiring layers extending on the surface of the low-side and high-side transistors perpendicular to transistor columns, the output wiring layers being electrically connected to an electrode region on a first side of the high-side and low-side transistor of the corresponding phase;

a high-side common terminal wiring layer having a terminal pad, the wiring layer extending parallel to the transistor columns, the high-side common terminal wiring layer being electrically connected to an electrode region on a second side of each high-side transistor; and a low-side common terminal wiring layer having a terminal pad, the wiring layer extending parallel to the transistor columns, the low-side common terminal wiring layer being electrically connected to an electrode region on a second side of each low-side transistor;

wherein the high-side common wiring layer, low-side common wiring layer, and the output wiring layers are arranged in an overlapping, multilayer-wiring structure.

4. A multilayer wiring structure for a high-current integrated circuit device as in claim 3, wherein the common terminal pads and the output pads are formed at the edge of the corresponding wiring layer and positioned at the outermost peripheries of the transistor regions.

5. A multilayer wiring structure for a high-current integrated circuit device as in claim 4, comprising control circuit means for controlling the switching operations of the high-side and low-side transistors, formed on a common semiconductor substrate and having input/output pads formed in regions adjoining the common terminal or output pads.

6. A multilayer wiring structure for a high-current integrated circuit device of n-phase, half-bridge circuit structure, having n pairs of high-side and low-side transistor regions, comprising:

a plurality of high-side transistors having multiple electrode regions, the number of transistors corresponding to the number of phases, the high-side transistors being arranged in parallel to one another;

a plurality of low-side transistors having multiple electrode regions, the number of transistors corresponding to the number of phases, the low-side transistor being arranged in parallel to one another and also to the high-side transistors;

a plurality of output wiring layer corresponding to the number of phases, each output wiring layer being positioned between the high-side and the low-side transistor of the corresponding phase;

a plurality of high-side common terminal wiring layers, one of the high-side common terminal wiring layers having a common terminal pad, the plurality of high-side common terminal wiring layers being connected to the high-side transistors via a first high-side connecting wiring, and the high-side wiring layers being connected to one another by a second high-side connecting wiring; and a plurality of low-side common terminal wiring layers, one of the low-side common terminal wiring layers having a common terminal pad, the plurality of low-side common terminal wiring layers being connected to the low-side transistors via a first low-side connecting wiring, and the low-side wiring layers being connected to one another by a second low-side connecting wiring;

wherein the wiring structure comprises overlapping wiring layers of minimized wiring distances.

7. A multilayer wiring structure for a high-current integrated circuit device as in claim 6, wherein the common terminal pads and the output pads are formed at the edge of the corresponding wiring layer and positioned at the outermost peripheries of the transistor regions.

8. A multilayer wiring structure for a high-current integrated circuit device as in claim 7, comprising control circuit means for controlling the switching operations of the high-side and low-side transistors, formed on a common semiconductor substrate and having input/output pads formed in regions adjoining the common terminal or output pads.

* * * * *